(12) United States Patent
Gan et al.

(10) Patent No.: US 6,308,309 B1
(45) Date of Patent: Oct. 23, 2001

(54) PLACE-HOLDING LIBRARY ELEMENTS FOR DEFINING ROUTING PATHS

(75) Inventors: Andy H. Gan, San Jose; Glenn A. Baxter, Scotts Valley, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/374,254

(22) Filed: Aug. 13, 1999

(51) Int. Cl.[7] .............................. G06F 19/00; G06F 7/38; G06F 17/50
(52) U.S. Cl. ................. 716/8; 716/2; 716/9; 716/10; 716/12; 326/39; 326/41; 700/121
(58) Field of Search ................. 716/2, 8, 9, 10, 716/12, 17, 18; 326/39, 41; 700/121

(56) References Cited

U.S. PATENT DOCUMENTS

| | | | |
|---|---|---|---|
| 4,918,614 | 4/1990 | Modarres et al. | 716/10 |
| 5,095,352 | * 3/1992 | Noda et al. | 257/202 |
| 5,469,003 | * 11/1995 | Kean | 326/39 |
| 5,726,903 | * 3/1998 | Kerzman et al. | 716/2 |
| 5,856,927 | * 1/1999 | Greidinger et al. | 716/12 |
| 5,861,761 | * 1/1999 | Kean | 326/41 |
| 5,870,313 | * 2/1999 | Boyle et al. | 716/10 |
| 5,903,461 | * 5/1999 | Rostoker et al. | 700/121 |
| 5,914,887 | * 6/1999 | Scepanovic et al. | 716/8 |
| 6,155,725 | * 12/2000 | Scepanovic et al. | 716/9 |

FOREIGN PATENT DOCUMENTS

410074840-A * 3/1998 (JP).

OTHER PUBLICATIONS

Michael John Sebastian Smith, "Application–Specific Integrated Circuits", published by Addison Wesley Longman, Inc., Copyright 1997, Chapters 16 and 17, pp. 853–959.

* cited by examiner

Primary Examiner—Matthew Smith
Assistant Examiner—Jibreel Speight
(74) Attorney, Agent, or Firm—Arthur Joseph Behiel

(57) ABSTRACT

Described is a method of using place-holding cells, or "stopper cells," to force a place-and-route tool to route a selected signal path through a particular physical location on a semiconductor die. In one method, phantom blocks, created from the design specification, define the area, logic, timing, and the placement of input/output (I/O) ports for a number of custom blocks. These phantom blocks are combined with any standard blocks to create a high-level description of a desired circuit. Then, for each I/O port of the custom blocks, a place-holding cell, or "stopper cell," is added to the description in the path defined between the I/O port and its source or destination. The stopper cells are then grouped with the associated custom blocks and the resulting collection of stopper cells and blocks are placed and routed. Completed custom blocks can then be substituted for respective phantom blocks after place and route. Stopper cells preserve complex routing during this substitution.

34 Claims, 5 Drawing Sheets

⬛ M1   ⬛ M2   ⊠ PORT   ○ VIA
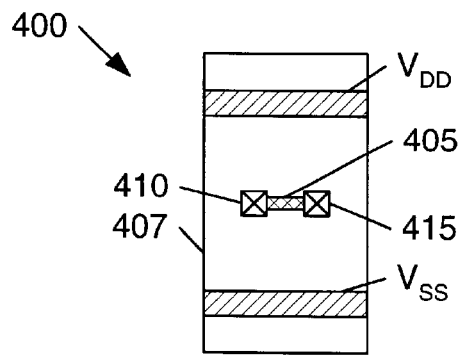
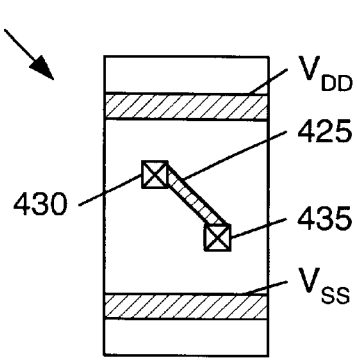
FIG. 4A         FIG. 4B
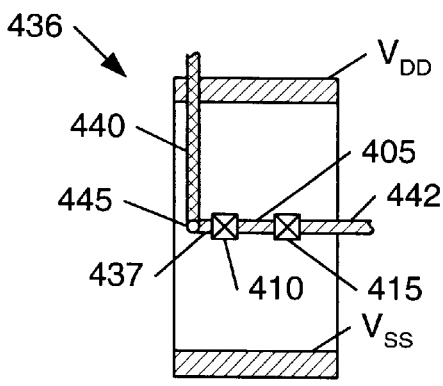
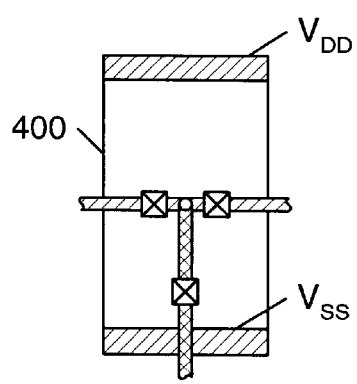
FIG. 4C         FIG. 4D
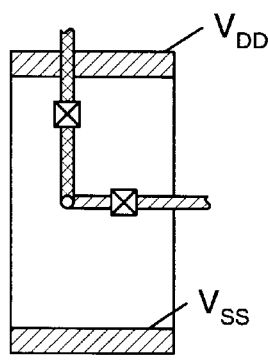
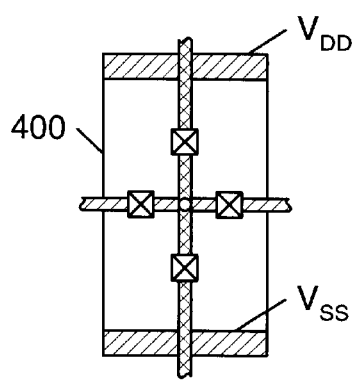
FIG. 4E         FIG. 4F

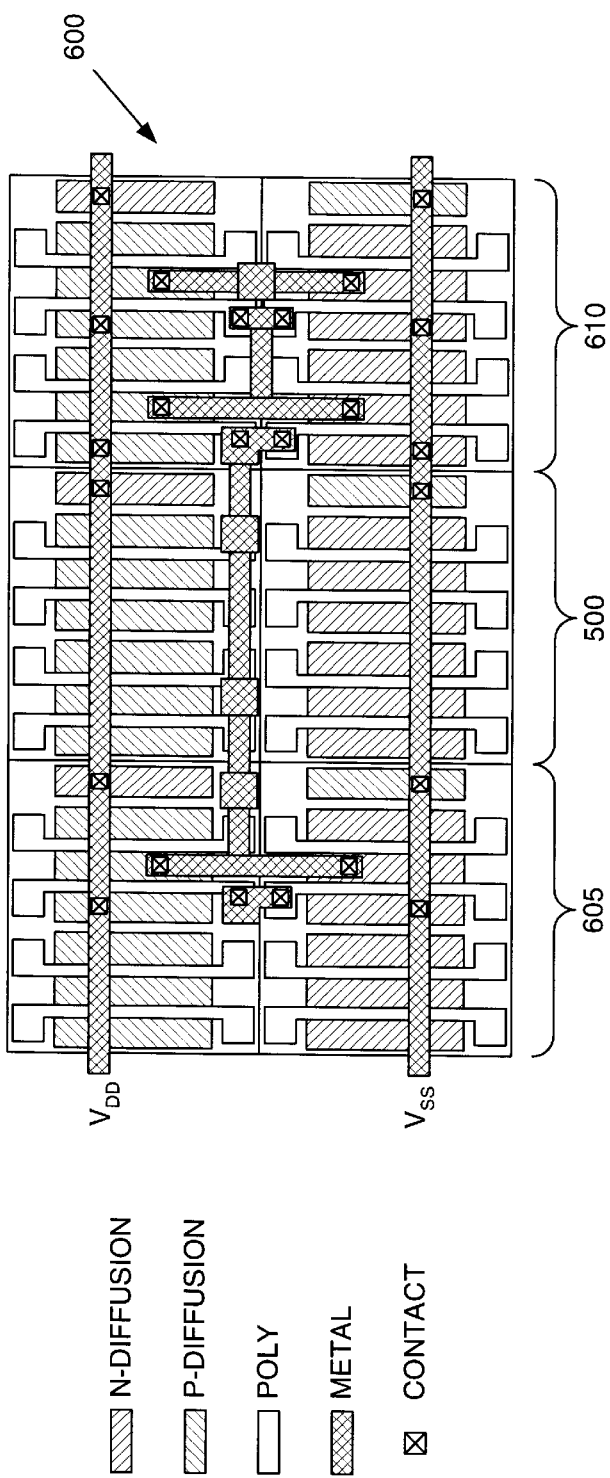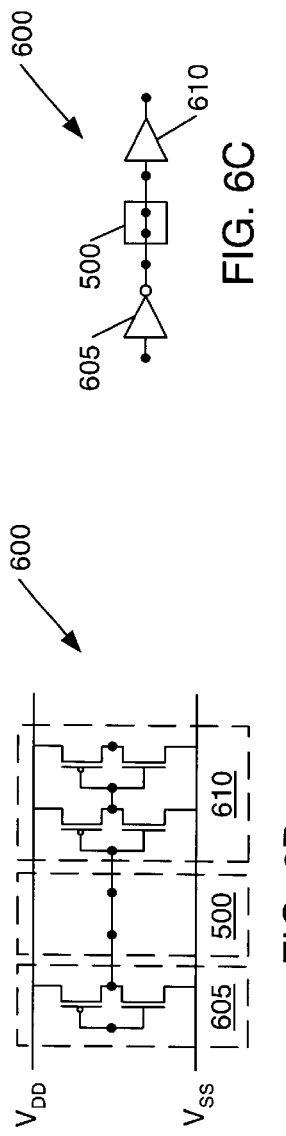
FIG. 6A
FIG. 6C
FIG. 6B

PLACE-HOLDING LIBRARY ELEMENTS FOR DEFINING ROUTING PATHS

FIELD OF THE INVENTION

This invention relates to the field of circuit design. In particular, the invention relates to specialized library cells that can be included in a circuit netlist to define selected routing paths to be employed by a routing tool.

BACKGROUND

Application-specific integrated circuits, or "ASICs," are circuits designed to satisfy the requirements of a particular electronic system. Designing an ASIC to implement a particular circuit function requires a number of steps. The first step is to create a design specification defining the function of the ASIC. The design specification sets forth the logic and timing parameters of the proposed circuit. Next, individual or teams of engineers design a circuit configuration that meets the design specification.

Circuit configurations are entered into an ASIC design system using either a hardware description language (HDL) and/or a schematic entry tool. HDLs represent circuits as lines of code, while schematic entry tools represent circuits using interconnected symbols that represent simple or complex logic functions. In either case, the logical components used to implement the circuit design are chosen from a library of ASIC cells that represent simple or complex logical operations. The resulting designs are then synthesized to produce a "netlist," a file that contains a description of all the components and interconnections in the circuit design.

The function and speed performance of ASIC cells are typically well characterized. Conventional design tools called logic simulators use custom test vectors and functional and timing information from the netlist to simulate the netlist to ensure that the design functions correctly. Next, a place-and-route tool determines the physical locations of the components in the netlist. Finally, the place-and-route tool defines the requisite connections between the various placed components.

FIG. 1A is a plan view of a gate array 100, an exemplary ASIC. Gate arrays begin as a nonspecific collection of logic gates. Late in the manufacturing process, metal layers are added to connect the gates. The manufacturer can configure the chip to perform any of myriad logic functions by changing the pattern of connections. This process is very popular because it saves both design and manufacturing time.

Gate array 100 includes a standard logic block 105 and a number of custom blocks 110, 120, and 130. Standard block 105 might be a conventional micro-controller, memory, or interface circuit that exists as part of an ASIC cell library. IC designers use standard blocks to save time. IC designers create custom blocks from collections of more basic cells to define custom logic functions.

Modern circuit designs are often far too complex to be designed by a single engineer—or even a single team of engineers—in a timely fashion. For this reason, complex circuit designs are typically broken down into functional blocks that are designed independently by design teams working concurrently. Separate sections of the design specification are allocated to different design groups. Each group is then tasked with designing a circuit block that meets the placement, logic, and timing requirements of one section, or "block," of the design specification.

Once the various block designs are complete, the blocks are compiled into a single netlist and are provided to another design team for placing and routing. FIG. 1B depicts the floor plan of FIG. 1A in which blocks 105, 110, 120, and 130 have been interconnected by a place-and-route tool.

FIG. 1B is illustrative; in practice, intrablock routing is vastly more complex. Not only are there a great many signal paths to define on a limited area, but the signal paths must often be manipulated by hand to solve timing problems and to improve circuit performance. Routing is therefore an iterative process of routing, simulating, troubleshooting, and rerouting. The processes of placing and routing an ASIC can add weeks or months to the implementation of a complex ASIC design.

ASICs are typically employed in products that have exceedingly short product lifetimes. Manufactures can affect the day at which a product is brought to market, but market forces typically dictate the end of product's lifetime. Time to market is therefore critical to profitability. There is therefore an ever-present need to speed the ASIC development process, and thereby reduce time to market.

SUMMARY

The present invention reduces time to market for ASICs by allowing custom blocks to be designed in parallel with the placement and routing of those blocks. Phantom blocks created from the design specification define the area, logic, timing, and the placement of input/output (I/O) ports for each custom block. These phantom blocks are combined with any standard blocks to create a high-level description of a desired circuit. Then, for each I/O port of the custom blocks, a place-holding cell, or "stopper cell," is added to the netlist in the path defined between the I/O port and its source or destination. The stopper cells are grouped with the associated phantom blocks and the resulting collection of stopper cells, phantom blocks, and standard blocks are placed and routed.

The stopper cells, phantom blocks, and standard blocks can be placed before the custom blocks are defined. Consequently, the task of routing the ASIC can take place concurrently with the task of designing the custom blocks. Then, once the custom blocks and the routing are defined, the custom blocks can be substituted for respective phantom blocks. The stopper cells preserve the complex routing within the ASIC during this substitution.

The invention contemplates stopper cells in two forms. The first form is a data structure that defines the components of the stopper cell; the second is the physical instantiation of the stopper cell on a semiconductor substrate. Data-structure stopper cells reside on a computer-readable medium, such as a magnetic tape or disk, as a portion of a netlist. Each of these stopper cells includes data fields representing power conductors that extend through the area defined by the stopper cell. Each stopper cell also includes a data field that defines an input port, an output port, and a signal conductor extending between them. The input port, output port, and the signal conductor are defined as electrically isolated from active components within the cell area.

The data structures that define stopper cells specify the connectivity of the stopper cells. The stopper cells can be incorporated into a netlist to define a physical location through which a signal between other library cells in the netlist. These stopper cells are a hybrid between a library cell and routing: they force a place-and-route tool to route a selected signal path through a particular physical location on a semiconductor die. Stopper cells can therefore be used to retain complex routing while removing, modifying, or replacing circuit components.

Each physical instantiation of a stopper cell occupies some die area and introduces some delay into the associated signal path. The impact on die area and delay should typically be as small as possible. One embodiment of the invention therefore employs a stopper cell that occupies very little area and introduces a minimal amount of delay.

Other features, aspects, and advantages of the invention will be apparent from the following description and claims. This summary does not define the invention, which is instead defined by the appended claims.

BRIEF DESCRIPTION OF THE FIGURES

FIG. 4A depicts one embodiment of a stopper cell 400 that has a minimal impact on die area and signal propagation delay.

FIG. 4B depicts a stopper cell 420 similar to stopper cell 410 of FIG. 4A.

FIG. 4C depicts a stopper cell 436 connected to a vertical conductive segment 440 and a horizontal conductive segment 442.

FIG. 4D depicts a stopper cell that employs two metal layers to create a T-shaped inter-layer connection.

FIG. 4E depicts a stopper cell that employs two metal layers to create an L-shaped inter-layer connection.

FIG. 4F depicts a stopper cell that employs two metal layers to create a cruciform inter-layer connection.

FIG. 6A depicts stopper cell 500 of FIG. 5 disposed between adjacent cells 605 and 610.

FIG. 6B schematically depicts cells 500, 605, and 610 of FIG. 6A at the transistor level.

FIG. 6C schematically depicts cells 500, 605, and 610 of FIG. 6A at the gate level.

DETAILED DESCRIPTION

The present invention reduces time to market for ASICs by allowing custom blocks to be designed in parallel with the placement and routing of those blocks. Phantom blocks, created from the design specification, define the area of each custom block, the placement of the input/output (I/O) of each custom block, and may also define the logic and timing of each custom block. These phantom blocks are combined with any standard blocks to create a high-level netlist of a desired circuit. Then, for each I/O port of the custom blocks, a place-holding cell, or "stopper cell," is added to the netlist in the path defined between the I/O port and its source or destination. The stopper cells are then grouped with the associated phantom blocks and the resulting collection of stopper cells, phantom blocks, and standard blocks are placed and routed. The place and route step produces placement information describing the physical locations of the various blocks, ports, and stopper cells. Back-annotated data is then available for simulation of the whole circuit.

Figure 1A:
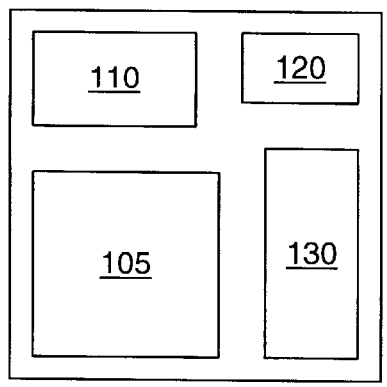
FIG. 1A is a plan view of a gate array 100, an exemplary ASIC.
Figure 1B:
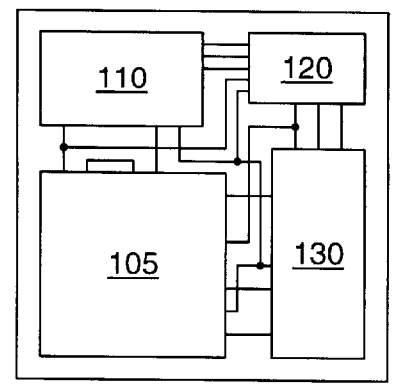
FIG. 1B depicts the floor plan of FIG. 1A in which blocks 105, 110, 120, and 130 have been interconnected by a place-and-route tool.
Figure 2:
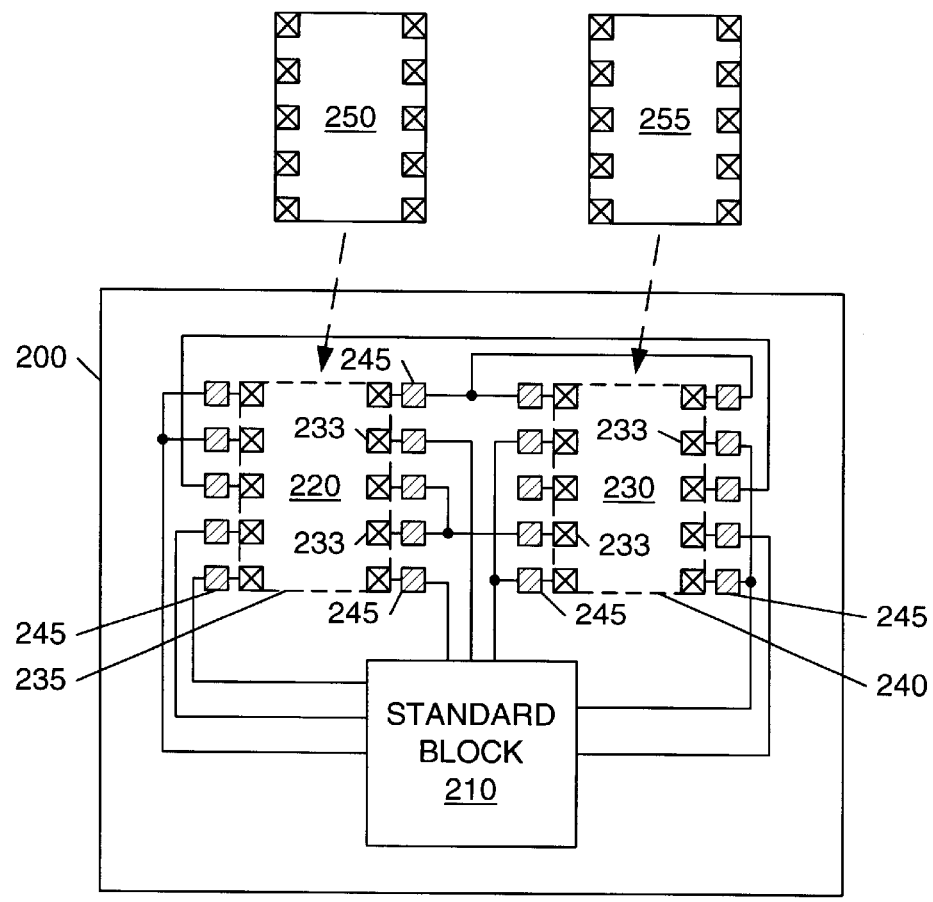
FIG. 2 is a plan view of an ASIC 200 in accordance with the invention.

FIG. 2 is a plan view of an ASIC 200 in accordance with the invention. ASIC 200 includes standard block 210 and a pair of phantom blocks 220 and 230. Phantom blocks 220 and 230, in turn, include collections of I/O ports 233. I/O ports 233 can be stopper cells, advantageously allowing for multiple place and route iterations within the corresponding phantom block. Phantom blocks 220 and 230 are defined within respective bounding boxes 235 and 240. "Bounding box" is a term of art that describes the smallest area that encloses all of the geometry of circuit design of cell. Bounding boxes 235 and 240 will eventually encompass custom blocks of circuitry, so the size of each bounding box is estimated based upon the complexity of the logic in the respective custom block. Until then, phantom blocks 220 and 230 are members of a high-level physical description of ASIC 200. In one embodiment, the high-level physical description is a library exchange format (LEF) data file. The LEF file contains placement information, and may also includes delay models of the future custom blocks developed from the design specification. Phantom blocks 220 and 230 could also be e.g. a reserved area, an HDL behavioral model with a reserved area, an HDL structural model with a reserved area, or fully defined custom blocks.

Surrounding each of phantom blocks 220 and 230 are numbers of stopper cells 245. Stopper cells 245, phantom blocks 220 and 230, and standard block 210 are all placed before the custom circuitry to be placed within bounding boxes 235 and 240 is completely designed. Consequently, the process of routing ASIC 200 can begin before the custom blocks are fully defined. Completed custom blocks 250 and 255 can then be substituted for respective phantom blocks 220 and 230 in the LEF file after ASIC 200 has been placed and routed. Stopper cells 245 preserve the complex routing within ASIC 200 during this substitution. The short net segments between stopper cells 245 and associated I/O ports 233 are eliminated, but are easily rerouted. The proximity of stopper cells 245 to the associated I/O ports 233 ensures that the net segments connecting them are rerouted without significantly impacting circuit timing.

Figure 3:
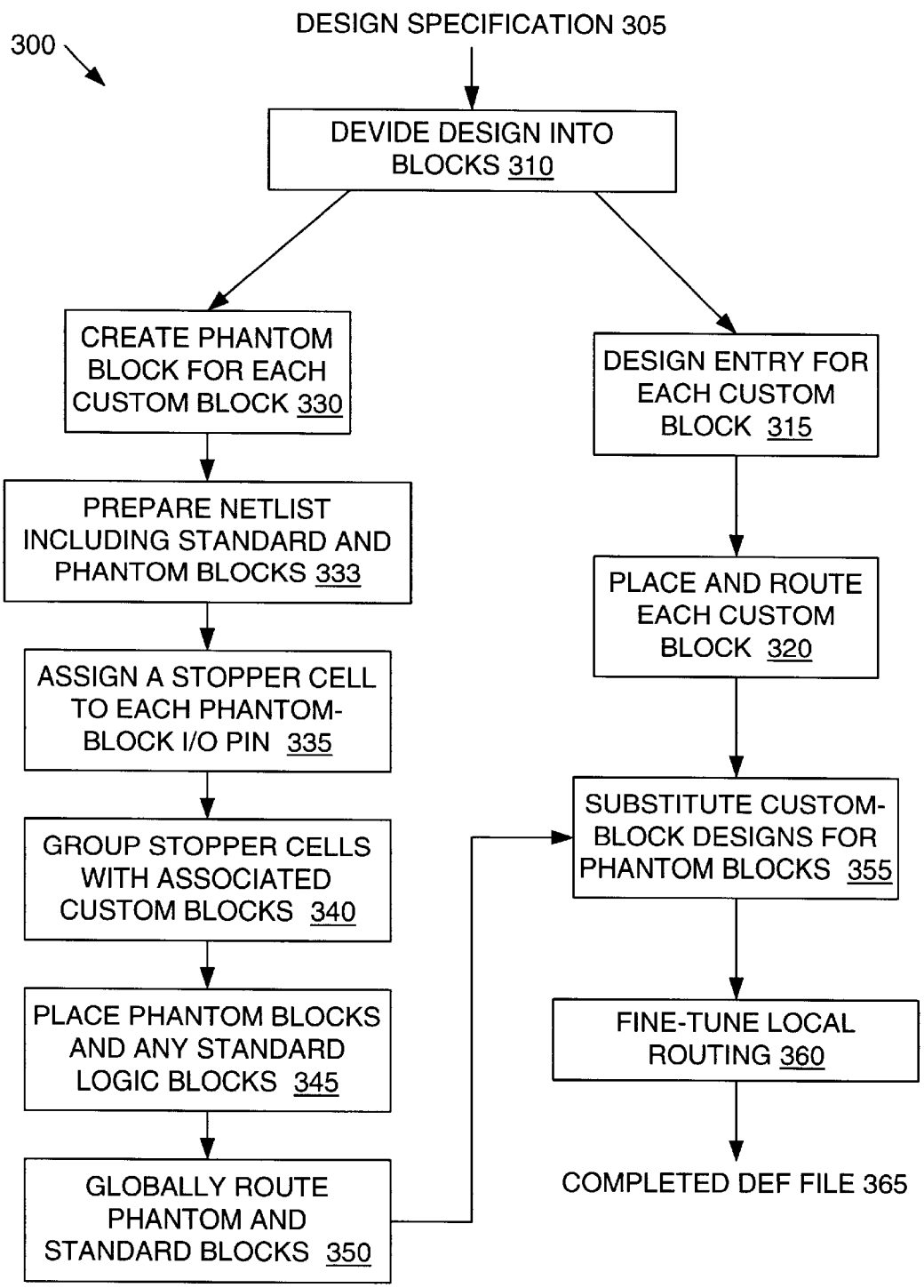
FIG. 3 is a flow chart 300 depicting the design flow for an ASIC developed in accordance with the invention.

FIG. 3 is a flow chart 300 depicting the design flow for an ASIC developed in accordance with the invention. The process begins with a design specification 305 that sets forth the critical logic and timing parameters to be implemented on the ASIC. Design specifications and their content are well understood by those of skill in the art.

As is common for complex ASIC designs, the design specification is broken down into a number of standard and custom blocks (step 310) to simplify the design process. Then, in accordance with the invention, the design flow is split into two branches so that the complete ASIC can be globally placed and routed before the design of each custom block is complete. Placing and routing the ASIC in parallel with block-level design saves valuable time, allowing ASIC manufacturers to reduce time to market.

The right leg of flow chart 300—block design—begins with creating, for each block, a circuit design that meets the requirements of the design specification (step 315). Completed circuit designs are entered into an ASIC design system using either a hardware description language (HDL) and/or a schematic entry tool. The resulting designs are then synthesized to produce netlists for each block.

Each circuit design of step 315 can be a behavioral model of one block of design specification 305 or a structural model of one block of design specification 305. The ability to simulate design specification 305 without having complete physical models for each block allows circuit designers to design and simulate individual blocks and the overall system in parallel, thus further reducing time to market.

Netlists describe logic cells and their interconnections, but do not include physical layout and routing information. Thus, each custom block must be placed and routed (step 320). For purposes of this specification, inter-block routing is referred to as local routing, whereas intra-block routing is referred to as global routing.

The ASIC can be globally routed concurrently with the design of the custom blocks. Referring to the left leg of flow chart 300, a "phantom" block is first created for each block of step 310 (step 330). These phantom blocks are combined with any standard blocks in step 333 to form a high-level level netlist. The phantom blocks define the I/O ports and connectivity of the custom blocks to be implemented. The phantom cells are so-called because the logic used to implement their associated function is not yet defined.

Next, in step 335, a stopper cell is assigned to each I/O port. This is done by adding a stopper cell to the netlist for each phantom-block I/O port. The netlist description of each stopper cell includes information describing which stopper-cell port connects to which phantom-block I/O port.

The associated stopper cell for each I/O port is placed physically close to the I/O port. Referring to FIG. 2, for example, stopper cells 245 are physically located near bounding boxes 235 and 240. The stopper cells and I/O ports are placed near one another (step 340) using the placement concept of "grouping." For example, phantom block 235 might be named Custom_1_block, the stopper cell associated with I/O port 1 of Custom_1_block might be named Custom_1_block_SC1, and the stopper cell associated with I/O port 2 of Custom_1_block might be named Custom_1_block_SC2. A conventional grouping constraint could then be added to the global netlist to group each element of the netlist designated as "Custom_1_Block." The grouped elements will then be placed proximate to one another by the place and route tool.

Having completed a global netlist that includes the phantom blocks, stopper cell, and any standard blocks, the global netlist is then loaded into a place and route tool, such as the Gate Ensemble™ place-and-route tool by Cadence. The place and route tool places any standard blocks, custom blocks, and stopper cells (step 345). In the final step of the left leg of flow chart 300, the place and route tool globally routes the circuit (step 350). As part of place and route, human operators typically fine-tune the placement and routing to solve routing and timing problems. The resulting circuit routing is conventional, except that each signal to and from each phantom block is routed through a stopper cell. In one embodiment, the output of step 350 is a design-exchange format (DEF) file for place and route.

The left and right legs of flow chart 300 merge upon completion of steps 320 and 350. The phantom blocks are removed from the DEF file and substituted with the completed custom block designs (step 355). Finally, the resulting DEF file is fine-tuned to solve potential timing and logic problems by altering local routing as needed (step 360), and possibly by adding or removing delay inducing circuit components.

Conventional place-and-route tools reroute nets associated with netlist elements that are modified, removed, or replaced. Thus, the short nets between stopper cells and their associated custom blocks are may be rerouted during step 360 if delay-inducing components are added or removed, or if local routing within any of the custom blocks is changed. However, the stopper cells maintain relatively more complex nets that extend between stopper cells and between stopper cells and standard blocks. Only the relatively simple routing between the stopper cells and the associated I/O ports will be rerouted, and this simple reroute is not likely to introduce any timing or routing errors due to the close proximity and single source-to-destination nature of the stopper-cell connections. The result of the final globally routed circuit is typically a placed and routed DEF file 365. DEF file 365 is then used to generate the files necessary to manufacture the desired integrated circuit.

A stopper cell is a hybrid between a library cell and routing. They force a place-and-route tool to route a selected signal path through a particular physical location. Stopper cells have applications outside of those described above in connection with FIGS. 2 and 3. For example, stopper cells can be used in combination with other cells to create variable delay elements adjusting signal timing, as described in the related application Ser. No. 09/374,399, entitled "Method and Apparatus for Timing Management in a Converted Design," by Glenn A. Baxter and Andy H. Gan, filed herewith and incorporated herein by reference.

Each stopper cell occupies some die area and introduces some delay into the associated signal path. The impact on die area and delay should typically be as small as possible. One embodiment of the invention therefore employs a novel stopper cell that occupies very little area and introduces no more than would otherwise be present in the circuit design.

FIG. 4A depicts one embodiment of a stopper cell 400 that has a minimal impact on die area and signal propagation delay. Stopper cell 400 is a library element that defines a conductive segment 405, an input port 410, and an output port 415. Stopper cells 400 is included in a netlist to hold the place of a selected signal line. Conductive segment 405 does not connect to any active circuit components within the bounding box 407 of stopper cell 400. Stopper cell 400 conventionally includes a pair of power conductors $V_{DD}$ and $V_{SS}$ for conveying power-supply voltages through stopper cell 400. Input ports 410 and output port 415 define the respective source and destination of the signal path in which stopper cell 400 is inserted.

The following is a LEF text specification of stopper cell 400. LEF, for "library exchange format, is a common industry standard format.

```

# HOLE is the cut layer between metal-1 and metal-2
# CT is the via between field and metal-1 through CONT (cut layer)

# ADDED VIA AD for METAL 1 ACCESS PIN
VIA AD
# RESISTANCE 0.4;          |
LAYER ALA;
RECT -1.2 -1.2 1.2 1.2;
# LAYER HOLE ;             | --> can be used to create
# RECT -0.5 -0.5 0.5 0.5;  |     Metal 2 accessible pin
# LAYER ALB;               |
# RECT -1.2 -1.2 1.2 1.2;  |
END AD

MACRO WSTP
```

-continued

```
    CLASS CORE ;
    FOREIGN WSTP -1.8 -1.8 ;
    SIZE 18.0 BY 50.4 ;
    SITE BCP 0 0 N DO 1 BY 1 STEP 14.4 50.4 ;
    SITE BCN 0 25.2 N DO 1 BY 1 STEP 14.4 50.4 ;
    ORIGIN 1.8 1.8 ;
    PIN A DIRECTION INPUT ;
        USE SIGNAL ;
        PORT
            LAYER ALA ;
            VIA 3.6 25.2 AD ;
            END
    END A
    PIN X DIRECTION OUTPUT ;
        USE SIGNAL ;
        PORT
            LAYER ALA ;
            VIA 10.8 25.2 AD ;
            END
    END X
    PIN VDD DIRECTION INOUT ;
        USE POWER ;
        SHAPE ABUTMENT ;
        PORT
            LAYER ALA ;
            WIDTH 2.4 ;
                PATH 0.0 10.8 14.4 10.8 ;
            VIA 0.0 10.8 CT ;
            VIA 7.2 10.8 CT ;
            VIA 14.4 10.8 CT ;
            END
    END VDD
    PIN VSS DIRECTION INOUT ;
        USE GROUND ;
        SHAPE ABUTMENT ;
        PORT
        LAYER ALA ;
        WIDTH 2.4 :
            PATH 0.0 36.0 14.4 36.0 ;
        VIA 0.0 36.0 CT ;
        VIA 7.2 36.0 CT
        VIA 14.4 36.0 CT
        END
    END VSS
    OBS
        LAYER ALA ;
        PATH 3.6 25.2
    END
END WSTP
```

The above LEF text specification is a textual representation of a data structure stored on a computer-readable medium, such as a magnetic or optical disk or a magnetic tape. The data structure defines the stopper cell, which is to be instantiated on a semiconductor die along with other library cells.

The data structure includes two data fields representing a plurality of power conductors extending through the cell area. The first of these data fields is bounded by the terms "PIN VDD DIRECTION INOUT" and "END VDD" in the above specification; the second of these data fields is similarly bounded by the terms "PIN VSS DIRECTION INOUT" and "END VSS." The data structure further includes a data field representing a signal conductor extending between an input port and an output port PIN A and an output port PIN X. Input port PIN A and output port PIN X are defined within a bounding box along with the signal conductor. Ports PIN A and PIN X are electrically isolated from active components within the cell area, as discussed below in connection with FIG. 5. In one embodiment, the power conductors are also electrically isolated from each active element within the cell area.

In practice, the above data structure will be a small, but part of a much larger data structure, which would include data fields defining the many cells to be implemented on the ASIC. For example, the larger data structure would include data fields defining the source and destination library cells for the stopper cell. The source cell typically defines some active circuit component connected through the stopper cell to another active circuit component in the destination cell (See FIG. 6, for example).

The simplicity of stopper cell 400 allows stopper cell 400 to be made very small, thus minimizing the die area required to maintain the physical location of a given line segment. Other stopper cells can be used as place holders in optimizing networks in accordance with the invention. For example, buffers, inverters, or multiplexers can also be stopper cells.

FIG. 4B depicts a stopper cell 420 similar to stopper cell 410 of FIG. 4A. Stopper cell 420 includes a conductive segment 425 that joins an input port 430 and an output port 435 at a 45-degree angle. Stopper cell 420 may be used, for example, to join parallel horizontal routing segments.

Stopper cells in accordance with the invention can be adapted to force a selected signal path to change metal layers, from layer one to layer two in a two-layer metalization process, for example. FIG. 4C depicts a stopper cell 436 connected to a vertical conductive segment 440 and a horizontal conductive segment 442. Stopper cell 436 is similar to stopper cell 400, like-number elements being the same. Conductive segment 440 is a portion of a second metal layer M2 disposed above the first metal layer M1. Metal layer M1 comprises conductive segment 405 and power conductors $V_{DD}$ and $V_{SS}$. Metal layer M2 is separated from metal layer M1 by an insulating layer (not shown). Line segment 440 connects to port 410 through a via 445 and a section of horizontal conductor 437. Conductive segments 440 and 442 connect to respective active components (not shown) in other logic cells.

FIGS. 4D, 4E, and 4F depict stopper cells that employ two metal layers to create respective T-shaped, L-shaped, and cruciform inter-layer connections.

Figure 5A:
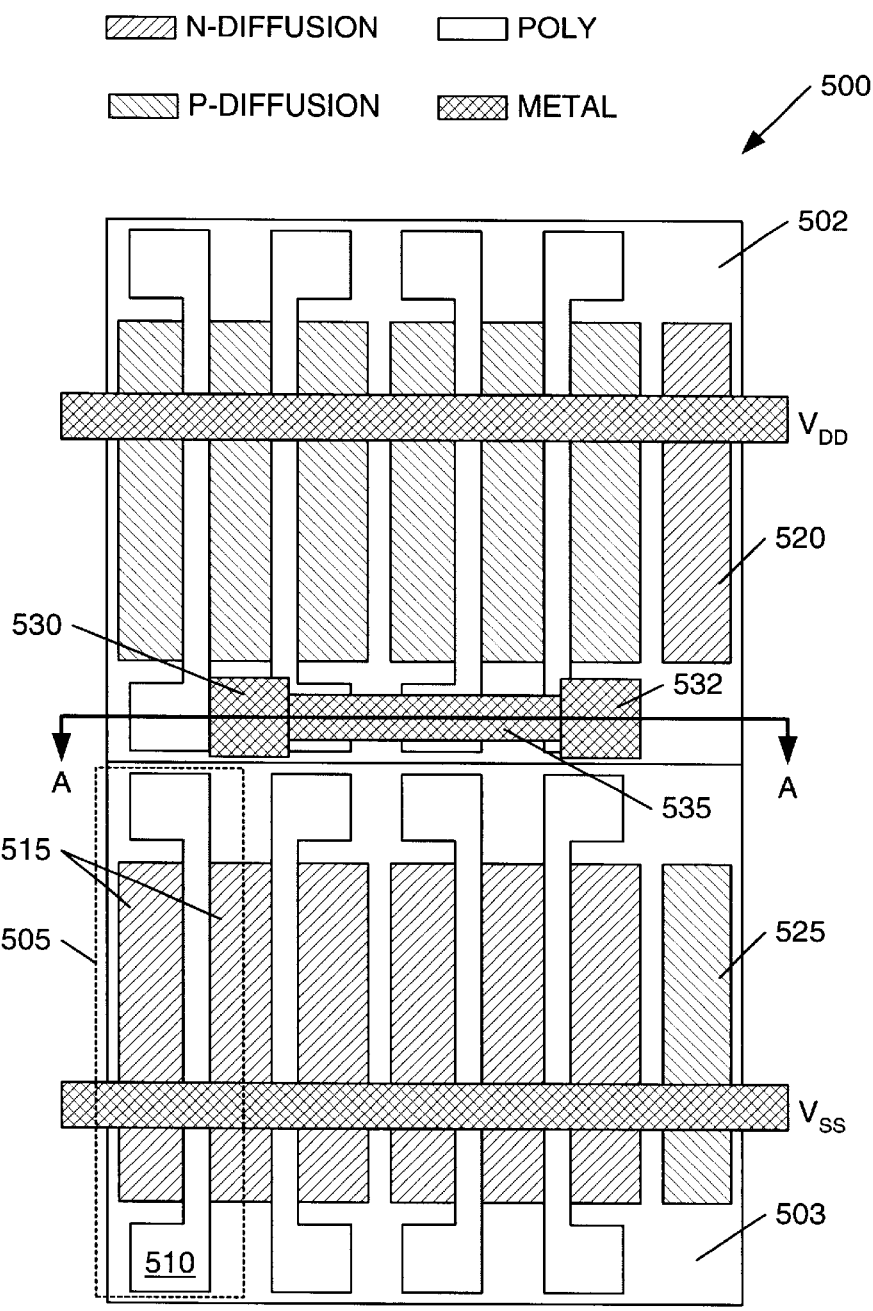
FIG. 5A depicts an exemplary oxide-isolated gate-array stopper cell 500 in accordance with one embodiment of the invention.
Figure 5B:
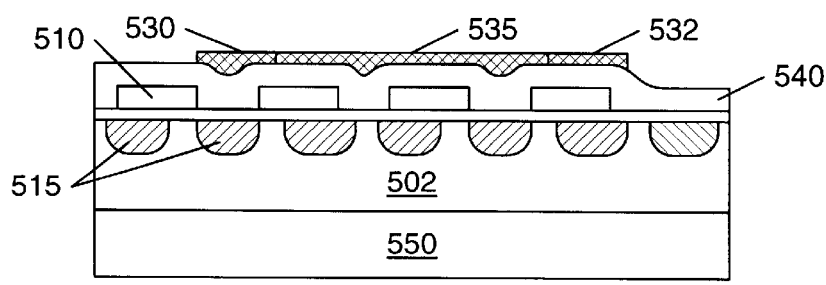
FIG. 5B depicts stopper cell 500 in cross-section along line A—A of FIG. 5A.

FIG. 5A depicts an exemplary oxide-isolated gate-array stopper cell 500 in accordance with one embodiment of the invention. Stopper cell 500 is a gate-array based cell that includes eight transistors formed within and upon an N-well 502 and a P-well 503. Wells 502 and 503 are in turn formed in a semiconductor substrate 550 (FIG. 5B). An exemplary transistor 505 includes a polysilicon gate 510 and N-type source and drain diffusions 515. The base cell also includes an N-type contact well 520, a P-type contact well 525, and a pair of power conductors $V_{DD}$ and $V_{SS}$. In accordance with the invention, the base cell additionally includes an input port 530, and output port 532, and a signal conductor 535.

FIG. 5B depicts stopper cell 500 in cross-section along line A—A of FIG. 5A. Ports 530 and signal conductor 535 are part of the same metal layer, and are separated from diffusions 515 and gates 510 by an insulating oxide layer 540. As is apparent from FIG. 5A, each of ports 530 and 532 have a minimum dimension in a plane parallel to the substrate that is greater than the minimum dimension of segment 535 in the same plane.

FIG. 6A depicts stopper cell 500 of FIG. 5 disposed between adjacent cells 605 and 610. Cells 605 and 610 are simple illustrative circuits—and inverter and buffer, respectively—that abut stopper cell 500 on semiconductor substrate 550. FIG. 6A illustrates that conductive segment 535 and ports 530 and 532 convey signals between active circuit components in other cells. Conventional place-and-route tools employ conductive segments called "feedthroughs" to covey signal lines through cells.

Feedthroughs are described in Chapter 16 of Michael John Sebastian Smith, *Application-Specific Integrated Circuits* (1997). That text is incorporated herein by reference.

Stopper cell 500 differs from conventional feedthroughs in that stopper cell 500 includes ports 530 and 532. Further, stopper cell 500, as defined in the netlist, defines the source and destinations for ports 530 and 532. Conventional feedthroughs provide place-and-route tools with usable paths, but do not dictate which signals will traverse that path.

FIG. 6B schematically depicts cells 500, 605, and 610 of FIG. 6A at the transistor level. FIG. 6C schematically depicts cells 500, 605, and 610 of FIG. 6A at the gate level.

While the present invention has been described in connection with specific embodiments, variations of these embodiments will be obvious to those of ordinary skill in the art. For example, in some embodiments, stopper cells include active components in addition to the conductive segments illustrated in FIGS. 4, 5A, and 5B. In addition, while stopper cells are described as implemented on a gate array, stopper cells in accordance with the invention may also be used to route other types of integrated circuits, many of which are described in Michael John Sebastian Smith, *Application-Specific Integrated Circuits* (1997). Such integrated circuits include standard cell, programmable logic devices, and FPGAs. Therefore, the spirit and scope of the appended claims should not be limited to the foregoing description.

What is claimed is:

1. A computer-readable medium having stored thereon a data structure defining a library cell to be instantiated on a semiconductor die within a cell area bounded by a bounding box, the data structure comprising:
   a. a first data field containing data representing a first power conductor extending through the cell area;
   b. a second data field containing data representing a second power conductor extending through the cell area; and
   c. a third data field containing data representing a signal conductor extending between an input port and an output port, wherein the input port, the output port, and the signal conductor are defined within the bounding box, and wherein the signal conductor is defined as electrically isolated from active components within the cell area.

2. The data structure of claim 1, wherein the power conductors are defined as being electrically isolated from active components within the cell area.

3. The data structure of claim 1, further comprising:
   a. a fourth data field containing data representing a second library cell that includes a first active semiconductor component; and
   b. a fifth data field containing data representing a third library cell that includes a second active semiconductor component;
   c. wherein the third data field further contains data representing:
      i. a first connection between the first active semiconductor component and the input port of the signal conductor; and
      ii. a second connection between the second active semiconductor component and the output port of the signal conductor.

4. The data structure of claim 1, wherein the data of the third data field defines a direction of the input port.

5. The data structure of claim 1, wherein the power conductors and the signal conductor are defined to run parallel to one another on the semiconductor die.

6. The data structure of claim 1, wherein the cell area consists essentially of inactive circuit components.

7. The data structure of claim 1, further comprising a fourth data field containing data representing a second signal conductor connected to the first-mentioned signal conductor and extending in a direction perpendicular to the first-mentioned signal conductor.

8. The data structure of claim 7, wherein the second signal conductor extends from the first-mentioned signal conductor to a third port.

9. The data structure of claim 8, wherein the second signal conductor extends from the first-mentioned signal conductor to a fourth port.

10. A stopper cell for use in combination with a plurality of additional library cells to form a netlist description of an integrated circuit formed on and within a semiconductor layer, the stopper cell defined by code comprising:
    a. data specifying a first conductor adapted to convey a first power-supply voltage through the stopper cell from a first adjacent one of the additional library cells to a second adjacent one of the additional library cells;
    b. data specifying a second conductor adapted to convey a second power-supply voltage through the stopper cell from the first adjacent library cell to the second adjacent library cell;
    c. data specifying an input port defined between the first and second conductors and electrically isolated from the first and second conductors and from a portion of the semiconductor layer beneath the stopper cell;
    d. data specifying an output port defined between the first and second conductors and electrically isolated from the first and second conductors and from the portion of the semiconductor layer beneath the stopper cell; and
    e. data specifying a third conductor connected between the input port and the output port.

11. The stopper cell of claim 10, wherein first, second, and third conductors are co-linear.

12. The stopper cell of claim 10, wherein the code does not define any active circuit components.

13. An integrated circuit comprising:
    a. a semiconductor layer;
    b. a first logic cell defined within a bounding box in a plane parallel to the semiconductor layer, the first logic cell including:
       i. an input port located within the bounding box;
       ii. an output port located within the bounding box; and
       iii. a conductive strip connected between the input port and the output port;
       iv. an insulating layer disposed over the semiconductor layer and separating the semiconductor layer within the first logic cell from each of the input port, the output port, and the conductive strip; and
       v. a conductive segment extending from the output port to an edge of the bounding box; and
    c. a second logic cell including an electrical contact extending between the semiconductor layer and the one conductive segment.

14. The integrated circuit of claim 13, the first logic cell further comprising:
    a. doped regions formed in the semiconductor layer within the first logic cell and underlying the insulating layer;
    b. wherein the insulating layer electrically separates the conductive strip, the input port, the output port, and the one conductive segment from the doped regions.

15. The integrated circuit of claim 13, wherein the conductive strip comprises a via.

16. The integrated circuit of claim 13, wherein the conductive strip and the conductive segment are both formed of a single metal layer.

17. The integrated circuit of claim 13, wherein the conductive strip and the conductive segment are perpendicular.

18. The integrated circuit of claim 13, wherein the second logic cell abuts the first logic cell.

19. The integrated circuit of claim 13, further comprising:
   a. a third logic cell including:
      i. a doped region formed in the semiconductor layer within the first logic cell and underlying the insulating layer; and
      ii. an electrical contact extending from the doped region; and
   b. a second conductive segment extending from the input port of the first logic cell to the electrical contact.

20. The integrated circuit of claim 13, wherein the input port of the first logic cell has a first minimum dimension in the plane parallel to the bounding box, wherein the conductive strip has a second minimum dimension in the plane parallel to the bounding box, and wherein the first minimum dimension is greater than the second minimum dimension.

21. The integrated circuit of claim 20, wherein the output port of the first logic cell has the first minimum dimension in the plane parallel to the bounding box.

22. The integrated circuit of claim 13, the first logic cell further comprising:
   a. a first power-supply conductor extending horizontally from a first vertical portion of the bounding box to a second vertical portion of the bounding box; and
   b. a second power-supply conductor extending horizontally from the first vertical portion of the bounding box to the second vertical portion of the bounding box.

23. The integrated circuit of claim 22, wherein the input and output ports of the first logic cell are disposed between the first and second power-supply conductors.

24. The integrated circuit of claim 22, wherein the conductive segment extends horizontally.

25. The integrated circuit of claim 22, wherein the conductive segment extends vertically.

26. The integrated circuit of claim 22, wherein the conductive segment extends in a direction neither parallel nor perpendicular to the first and second power-supply conductors.

27. The integrated circuit of claim 13, further comprising a second conductive strip electrically connected to the first-mentioned conductive strip and extending in a direction not parallel to the first-mentioned conductive strip.

28. The integrated circuit of claim 27, further comprising a via disposed between the first-mentioned and second conductive strips.

29. The integrated circuit of claim 27, further comprising a third port located within the boundary of the bounding box and electrically connected to the second conductive strip.

30. A method of routing functional blocks of an integrated circuit, the method comprising:
   a. preparing a netlist that includes data structures defining each functional block, the data structure including data representing input and output ports for each functional block;
   b. associating a place-holding cell with each at least one of the input and output ports of one of the functional blocks, the place-holding cell including a first port defined as connected to the at least one port;
   c. adding the place-holding cell to the netlist;
   d. grouping the place-holding cell with the one functional block;
   e. defining routing paths interconnecting the functional blocks, wherein one of the routing paths extends through the place-holding cell to the at least one of the input and output ports.

31. The method of claim 30, further comprising replacing the data structure defining the one functional block with a second data structure defining a second functional block.

32. The method of claim 31, further comprising defining a routing path between the place-holding cell and the second functional block after replacing the data structure defining the one functional block.

33. The method of claim 31, wherein the one functional block includes information specifying the position and connectivity of the input and output ports, and wherein the second functional block includes the information.

34. The method of claim 31, wherein the second functional defines circuitry not defined in the one functional block.

* * * * *